United States Patent
Stemmle et al.

(10) Patent No.: US 8,304,650 B2
(45) Date of Patent: Nov. 6, 2012

(54) ARRANGEMENT FOR CURRENT LIMITING

(75) Inventors: Mark Stemmle, Hannover (DE); Rainer Soika, Hannover (DE)

(73) Assignee: NEXANS, Paris (FR)

( * ) Notice: Subject to any disclaimer, the term of this patent is extended or adjusted under 35 U.S.C. 154(b) by 178 days.

(21) Appl. No.: 12/706,182

(22) Filed: Feb. 16, 2010

(65) Prior Publication Data
US 2010/0230126 A1 Sep. 16, 2010

(30) Foreign Application Priority Data

Mar. 13, 2009 (EP) .................................. 09290181

(51) Int. Cl.
*H01B 11/02* (2006.01)
(52) U.S. Cl. ...... 174/33; 174/15.4; 174/15.5; 174/125.1
(58) Field of Classification Search .................. 174/68.1, 174/33, 125.1, 15.4, 15.5
See application file for complete search history.

(56) References Cited

U.S. PATENT DOCUMENTS

| | | | | |
|---|---|---|---|---|
| 3,643,002 A | * | 2/1972 | Minnich | 174/15.5 |
| 6,759,593 B2 | * | 7/2004 | Spreafico | 174/125.1 |
| 2003/0183410 A1 | * | 10/2003 | Sinha et al. | 174/68.1 |
| 2008/0217269 A1 | | 9/2008 | Topping et al. | |

* cited by examiner

*Primary Examiner* — Yuriy Semenenko
*Assistant Examiner* — Andargie M Aychillhum
(74) *Attorney, Agent, or Firm* — Sofer & Haroun, LLP

(57) ABSTRACT

An arrangement for current limiting is specified, using components (4, 5, 6) composed of a superconducting material which are arranged in a cryostat (KR) which comprises two metallic tubes (1, 2) which are arranged concentrically with respect to one another and between which vacuum insulation (3) is fitted, and which cryostat surrounds a free space (FR) for a coolant to pass through. The components (4, 5, 6) each comprise three phase conductors (7, 8, 9) composed of a superconducting material based on rare earths (ReBCO), which are arranged insulated from one another and concentrically with respect to one another. "n" components (4, 5, 6) are arranged in the cryostat (KR) and their phase conductors are cyclically electrically conductively connected to one another such that the inner phase conductor (7) of each component is connected to the centre phase conductor (8) of a second component, and this centre phase conductor (8) is connected to the outer phase conductor (9) of the third component, where n=3 or an integer multiple of 3.

9 Claims, 2 Drawing Sheets

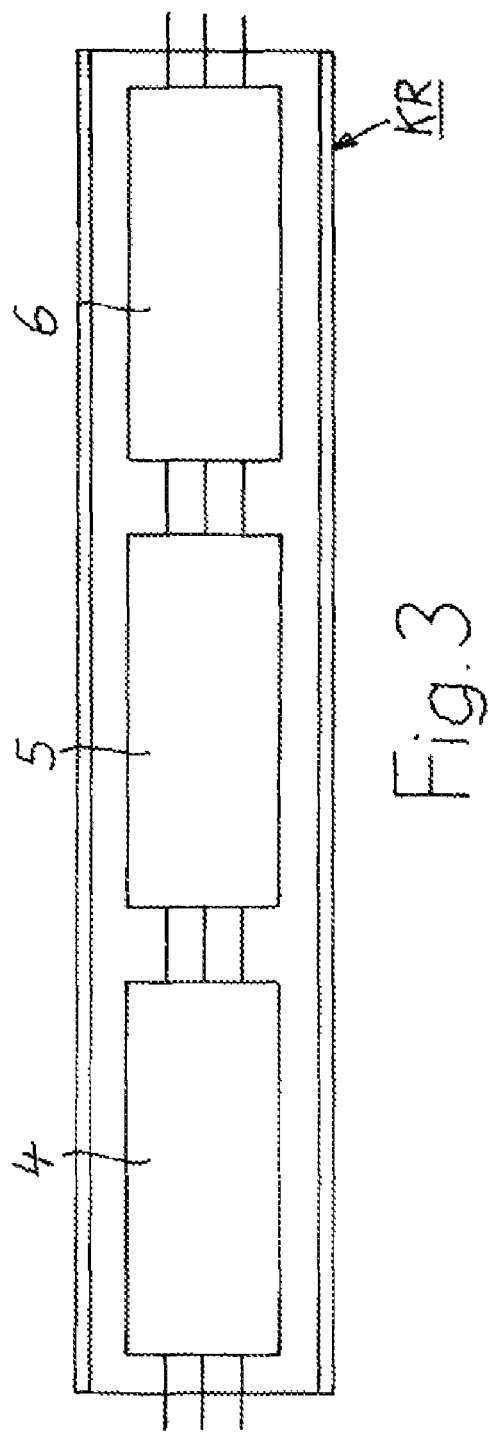
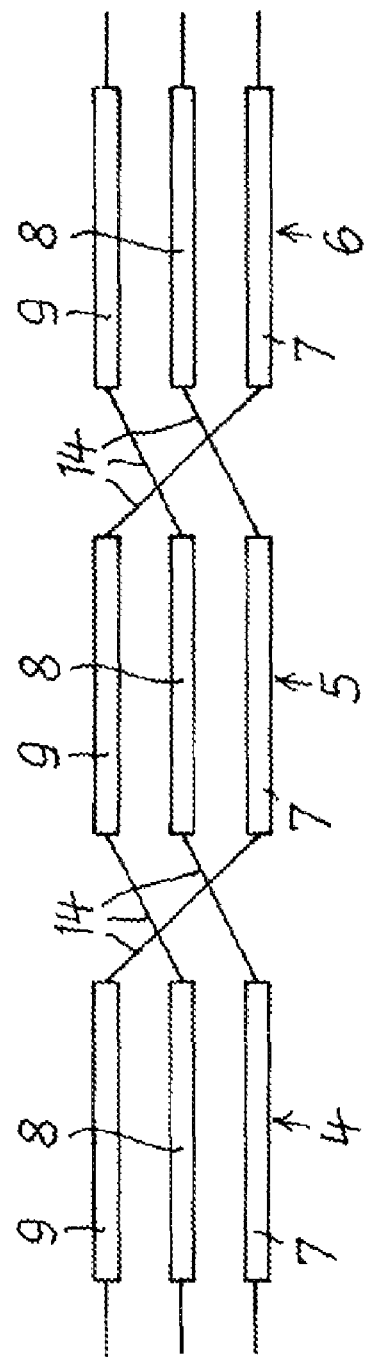

ARRANGEMENT FOR CURRENT LIMITING

RELATED APPLICATIONS

This application claims the benefit of priority from European Patent Application No. 09290181.8, filed on Mar. 13, 2009, the entirety of which is incorporated by reference.

BACKGROUND

1. Field of the Invention

The invention relates to an arrangement for current limiting, using components composed of a superconducting material which are arranged in a cryostat which comprises two metallic tubes which are arranged concentrically with respect to one another and between which vacuum insulation is fitted, and which cryostat surrounds a free space for a coolant to pass through (EP 1 681 731 A1).

2. Description of Related Art

By way of example, superconducting materials are used as conductors in cables which are used for electrical power transmission. In modern technology, the superconducting material comprises a composite material which contains ceramic material, which changes to the superconducting state at sufficiently low temperatures. The electrical direct-current resistance of a conductor constructed in this way is zero if the cooling is adequate, provided that a specific current level, the critical current level, is not exceeded. By way of example, suitable ceramic materials are oxidic materials based on rare earths (ReBCO), in particular YBCO (yttrium-barium-copper oxide), or BSCCO (bismuth-strontium-calcium-copper oxide). By way of example, sufficiently low temperatures to change such a material to the superconducting state are between 67 K and 110 K. By way of example, suitable coolants are nitrogen, helium, neon and hydrogen or mixtures of these substances.

An arrangement fore current limiting, as described initially, can be installed as a type of fuse in any desired transmission path, such as a cable path or else a switchgear assembly, via which or in which currents of greater or lesser magnitude are transmitted. The aim is to prevent considerable damage occurring to the transmission path to be protected, in the event of a short circuit acting on the latter. In the event of a short circuit, the electrical impedance of the arrangement rises considerably in such a way that this itself greatly reduces the peak short-circuit current. The transmission path can then be interrupted by a circuit breaker in order to overcome the short circuit. Once the cause of the short circuit has been rectified, the transmission path can be reconnected without any need to make any changes to the current-limiting arrangement.

The initially cited EP 1 681 731 A1 describes an arrangement having at least one superconducting component for current limiting. The component comprises a cylindrical support composed of superconducting material around which a superconducting conductor is wound, with a normal conductor connected in parallel with it. A plurality of such components are arranged connected electrically in series or in parallel in order to produce a current limiter.

OBJECTS AND SUMMARY

The invention is based on the object of making the arrangement described initially simpler.

According to the, invention, this object is achieved
in that the components each comprise three phase conductors composed of an ReBCO material, which are arranged insulated from one another and concentrically with respect to one another, and
in that "n" components are arranged in the cryostat and their phase conductors are cyclically electrically conductively connected to one another such that the inner phase conductor of each component is connected to the centre phase conductor of a second component, and this centre phase conductor is connected to the outer phase conductor of the third component, where n=3 or an integer multiple of 3.

The ReBCO material is a so-called second-generation superconducting material. Conductors composed of ReBCO material have a considerably lower electrical resistance in the normal conductive range than conductors composed of first-generation material, for example BSCCO. The phase conductors of the components are expediently designed such that their critical current level corresponds to the amplitude of the current level beyond which short-circuit current limiting is intended to occur. On reaching this current level, the superconducting material of the phase conductors changes to the normally conductive state. In this state, the ReBCO material is electrically poorly conductive, thus directly resulting in a major increase in the resistance of the phase conductors, that is to say an increase in the electrical impedance of the components. The short-circuit current flowing via the arrangement is therefore noticeably and quickly limited. The energy introduced by the short-circuit current into the components leads to them being heated. Once the short-circuit current has been limited, the arrangement is thus expediently disconnected from the transmission path, in order to allow the components to cool down quickly. This ensures that the arrangement is not damaged by a short-circuit current. After a short cooling-down time and after the cause of the short circuit on the transmission path has been rectified, it is ready to operate again, without any measures whatsoever.

When, in one preferred embodiment of the arrangement, only three components of the superconducting cable are used, then only a small number of contacts are required for connection of the phase conductors. This reduces the contact-dependent losses, particularly when first-generation superconducting conductors, for example BSCCO conductors, are used for connecting the respective phase conductors. The cyclic through-connection of the three different phase conductors in the three different components of the arrangement is particularly advantageous because this results in the entire arrangement having a particularly uniform impedance. An arrangement with three components also allows the arrangement to be made very compact, with the cryostat having a relatively small surface area, and correspondingly low thermal losses. During normal operation, the mutual compensation means that no electromagnetic fields occur outside the concentric arrangement of the phase conductors in each component. No eddy currents can therefore be induced in the cryostat, which would likewise lead to losses.

BRIEF DESCRIPTION OF THE DRAWINGS

Exemplary embodiments of the subject matter according to the invention are illustrated in the drawings.

In the drawings:

FIG. 3 shows an embodiment of the arrangement, modified from that shown in FIG. 1, likewise in the form of a schematic illustration.

FIG. 4 shows a layout of the electrically conductive connection between components of the arrangement.

DETAILED DESCRIPTION

The arrangement according to the invention will be explained in the following text for three (n=3) components each having three superconducting phase conductors. With an appropriate design, two or more units, each having three such components, could also be accommodated in one cryostat.

Figure 1:
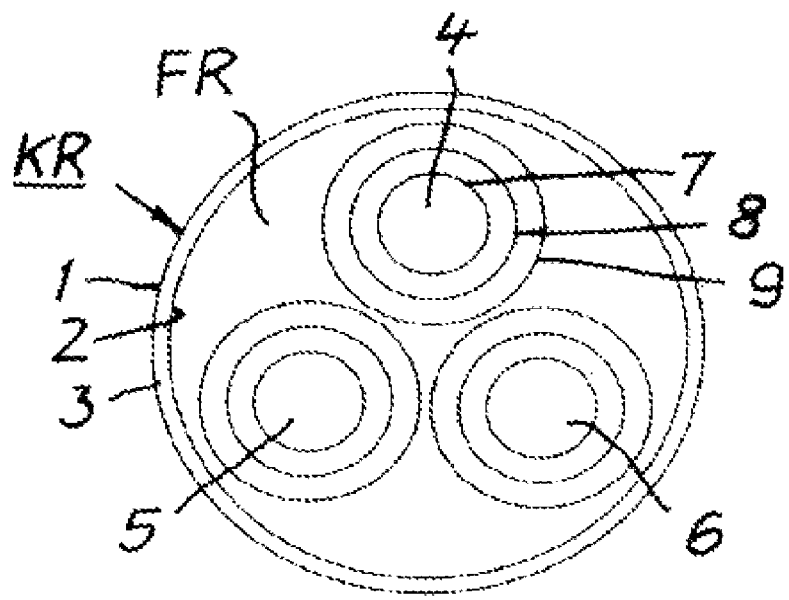
FIG. 1 shows a schematic illustration of a side view of the arrangement according to the invention.

FIG. 1 shows a cryostat KR comprising two metallic tubes 1 and 2 which are arranged coaxially with respect to one another. Vacuum insulation 3 is located between the tubes 1 and 2, which may also be corrugated transversely with respect to their longitudinal direction. The cryostat KR surrounds a free space FR for a coolant to pass through, in which free space FR three components 4, 5 and 6 are arranged, which each have three phase conductors 7, 8 and 9, which are insulated from one another and are arranged concentrically with respect to one another.

The superconducting phase conductors 7, 8 and 9 advantageously comprise ribbons composed of ReBCO, to be precise preferably YBCO. The inner phase conductor 7 is shaped around a support 10, which, in the illustrated exemplary embodiment, is in the form of a tube, which is advantageously composed of glass-fibre-reinforced plastic. A strand could also be used as support 10. The phase conductor 7 is concentrically surrounded at a distance by the centre phase conductor 8, which is itself likewise concentrically surrounded at a distance by the outer phase conductor 9. The concentric gaps between the phase conductors are an insulating layer 11 between the phase conductors 7 and and an insulating layer 12 between the phase conductors 8 and 9.

The insulating layers 11 and 12 are advantageously free gaps through which the coolant that is passed through the cryostat can pass, in the same way as through the support 10, during operation of the arrangement, when the support 10 is in the form of a tube. This allows the arrangement to cool down more quickly once a short circuit has been rectified. The free gaps between the phase conductors can be held in at their ends without further aids, if the phase conductors are held appropriately. However, it is also possible to fit spacers composed of insulating material, but using little material, between the phase conductors at a small number of points over the course of the phase conductors, which spacers form scarcely any impediment to the coolant passing through between the phase conductors. It is also possible to use tubes composed of insulating material as insulating layers 11 and 12, for example tubes composed of glass-fibre-reinforced plastic.

Figure 2:
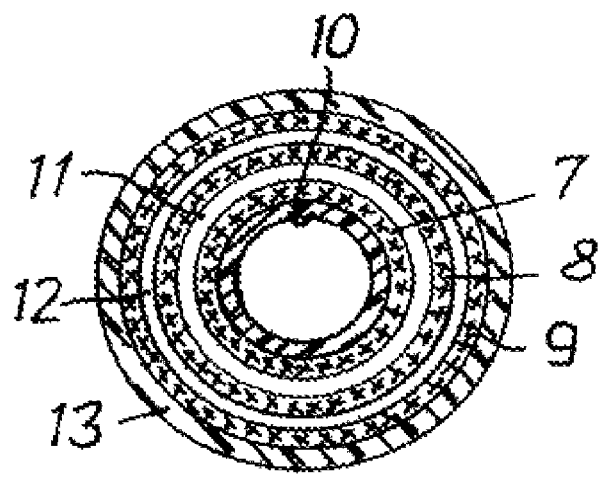
FIG. 2 shows a detail of the arrangement shown in FIG. 1, illustrated enlarged.

In the embodiment shown in FIG. 1, the three components 4, 5 and 6 can be arranged in the cryostat KR such that they do not touch one another but such that the coolant flows around them during operation of the arrangement. However, an insulating layer 13, as shown in FIG. 2, can also be fitted over the outer phase conductor 9 of the components 4, 5 and 6.

The phase conductors 7, 8 and 9 advantageously comprise ribbons with YBCO material applied, which are wound around their respective substrate in at least two layers. The layers comprising the ribbons are insulated from one another. A plurality of ribbons are arranged alongside one another in the individual layers, are likewise insulated from one another, and are electrically connected in parallel. In order to achieve as long a length of YBCO material as possible, the ribbons are advantageously wound on with a short lay. The winding direction of the individual layers can preferably be in opposite senses. Instead of the ribbons, it is also possible to use wires to which YBCO material is applied. The lay lengths and lay directions of the ribbons are selected such that the phase conductors 7, 8 and 9 have as little inductance as possible.

As can be seen in FIG. 1, the components 4, 5 and 6 are arranged alongside one another in the cryostat KR. This allows the arrangement to be axially short and compact. As can be seen in FIG. 3, however, the components 4, 5 and 6 can also be fitted one behind the other in the cryostat KR, thus making it possible to reduce the diameter of the cryostat KR. In both embodiments, the cryostat has a relatively small outer surface area, with correspondingly low thermal losses.

The phase conductors 7, 8 and 9 of the three components 4, 5 and 6 are electrically conductively connected to one another. Connecting conductors 14 composed of BSCCO are advantageously used for this purpose. As can be seen in FIG. 4, the connection is made cyclically with space being exchanged, such that each phase conductor in the arrangement occupies each of the three possible positions.

In this sense, by way of example, the outer phase conductor 9 of the component 4 is connected to the inner phase conductor 7 of the component 5 and, passing on further, to the centre phase conductor 8 of the component 6. The centre phase conductor 8 of the component 4 is connected to the outer phase conductor 9 of the component 5 and, passing on further, to the inner phase conductor 7 of the component 6. The inner phase conductor 7 of the component 4 is likewise connected to the centre phase conductor 8 of the component 5 and, passing on further, to the outer phase conductor 9 of the component 6. The corresponding connecting conductors 14 are shown as crossing lines in FIG. 4.

The arrangement manufactured in this way is connected in a transmission path of electric current, for use. The components 4, 5 and 6 are then part of this transmission path. If a short circuit occurs in the power supply system, a current with an increased current level flows via the transmission path. If this current level is higher than the critical current level in the phase conductors 7, 8 and 9 of the components 4, 5 and 6, their electrical resistance suddenly increases considerably, resulting in a sudden increase in the electrical impedance of the arrangement. This is registered in an appropriate monitoring circuit, and leads to the transmission path being disconnected. This allows the components 4, 5 and 6 to cool down immediately. As soon as the cause of the short circuit has been rectified, the transmission path can be reconnected.

The invention claimed is:

1. Arrangement for current limiting comprising:
  components having superconducting material; and
  a cryostat, in which said components are arranged, said cryostat having two metallic tubes which are arranged concentrically with respect to one another and between which vacuum insulation is fitted and which said cryostat surrounds a free space for a coolant to pass through, wherein
  said components each have three phase conductors composed of a superconducting material based on rare earths (ReBCO), which are arranged insulated from one another and concentrically with respect to one another, and
  in that "n" components are arranged in the cryostat (KR) and their phase conductors are cyclically electrically conductively connected to one another such that the inner phase conductor of each component is connected to the centre phase conductor of a second component, and this centre phase conductor is connected to the outer phase conductor of the third component, where n=3 or an integer multiple of 3.

2. Arrangement according to claim 1, wherein the phase Conductors, have ribbons which support the superconducting material, are insulated from one another and are wound around a support in at least two layers, are insulated from one another and are arranged one above the other preferably with a short lay length.

3. Arrangement according to claim 2, wherein the lay length and the lay direction of the ribbons are designed to substantially reduce inductance.

4. Arrangement according to claim 2, wherein the ribbons of the individual layers are electrically connected in parallel.

5. Arrangement according to claim 2, wherein the phase conductors have a short lay length.

6. Arrangement according to claim 1, wherein the components are arranged physically alongside one another.

7. Arrangement according to claims 1, wherein the components are arranged physically axially one behind the other.

8. Arrangement according to claims 1, wherein the phase conductors are composed of YBCO.

9. Arrangement according to claims 1, wherein superconducting conductors composed of BSCCO are used as connecting conductors between the phase conductors of the components.

* * * * *